United States Patent [19]

Sturm

[11] Patent Number: 5,039,570
[45] Date of Patent: Aug. 13, 1991

[54] RESISTIVE LAMINATE FOR PRINTED CIRCUIT BOARDS, METHOD AND APPARATUS FOR FORMING THE SAME

[75] Inventor: Christian W. Sturm, N. Mankato, Minn.

[73] Assignee: Planar Circuit Technologies, Inc., St. Peter, Minn.

[21] Appl. No.: 509,363

[22] Filed: Apr. 12, 1990

[51] Int. Cl.⁵ .......................... B32B 3/00; B44C 1/22; C23C 14/00; C23F 1/02
[52] U.S. Cl. ...................................... 428/209; 29/620; 118/728; 156/630; 156/643; 156/656; 156/659.1; 156/272.6; 156/902; 204/192.21; 204/298.15; 338/308; 428/901
[58] Field of Search .................. 29/610.1, 620; 134/1; 204/192.21, 298.01, 298.15; 156/630, 643, 656, 659.1, 272.6, 901, 902; 118/728, 50.1, 620; 428/601, 209, 457, 458, 901; 338/308, 314

[56] References Cited

U.S. PATENT DOCUMENTS

| | | | |
|---|---|---|---|
| 2,662,957 | 12/1953 | Eisler | 156/901 X |
| 3,244,581 | 4/1966 | Miller | 156/901 X |
| 3,400,066 | 9/1968 | Caswell et al. | 204/192.21 |
| 4,021,277 | 5/1977 | Shirn et al. | 29/620 X |
| 4,368,252 | 1/1983 | Kakuhashi et al. | 156/902 X |
| 4,540,463 | 9/1985 | Kakuhashi et al. | 29/620 X |

*Primary Examiner*—William A. Powell
*Attorney, Agent, or Firm*—Douglas L. Tschida

[57] ABSTRACT

A relatively large dimensioned sputter coated resistive laminate providing uniform laminate dimensions and resistance tolerances over the surface area thereof and a method for making the laminate from a foil, including a platten support step and a sputter etching or cleaning step. The laminate comprises a sputter coated metal foil which is isostatically bonded to an insulative, epoxy resin substrate. In a preferred construction a nickel-chrome-aluminum-silicon resistive layer is applied to a copper foil.

21 Claims, 4 Drawing Sheets

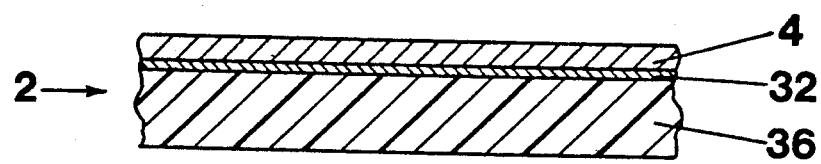
Fig. 2
Fig. 3a
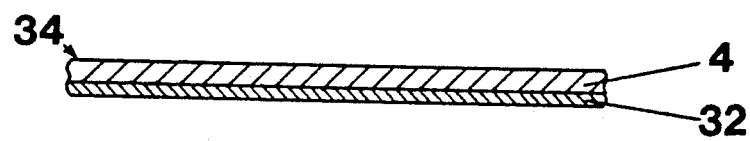
Fig. 3b
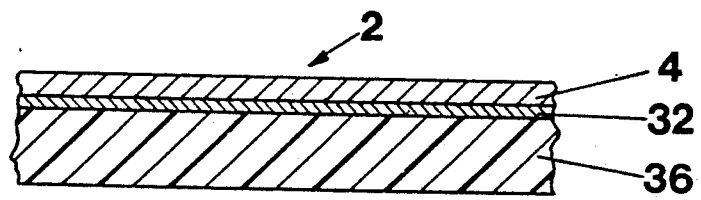
Fig. 3c
Fig. 3
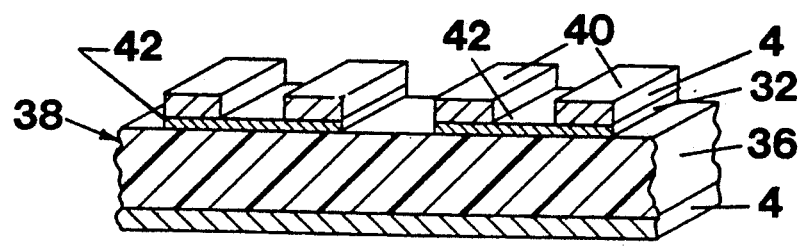
Fig. 6

RESISTIVE LAMINATE FOR PRINTED CIRCUIT BOARDS, METHOD AND APPARATUS FOR FORMING THE SAME

BACKGROUND OF THE INVENTION

The present invention relates to multi-layered printed circuit boards and, in particular, to a method for constructing a resistive laminate usable therewith for producing boards with embedded resistive layers and usable for high frequency signals.

With the ever increasing complexities and demands for faster and faster cycle times for digital computers and digital signal processing circuitry, along with a desire to minimize extraneous discrete circuit components, have evolved more complex multi-layer printed circuit board assemblies. Many of such boards include conductive layers containing patterned components which perform like specific discrete components.

One particular laminate usable in such boards is a resistive laminate which can be photo-lithographically processed to define predetermined resistance paths that can be accessed through various well known techniques by other circuitry contained on the board. Applicant is aware of various prior art resistive laminates which have been constructed using conventional liquid bath, plating techniques. However, when formed to relatively large dimensions, for example, for use in so called "mother boards" or the like these laminates are prone to exhibit resistive paths of non-uniform thicknesses, and therefore non-uniform resistance values, across the surface of the laminate. Imprecise signal characteristics, especially at relatively high frequencies, oftentimes result.

Through the use of hydraulic laminating techniques, the laminates and resultant boards have also exhibited characteristics indicative of stressed conductive and resistive layers which can affect yields of the corresponding multi-layered boards which use the laminates. Appreciating further the complexities and costs to scrap or re-work such boards, strong economic incentives exist to develop component laminates of high integrity and tight tolerances, both mechanically and electrically.

Relative, in particular, to nickel-chrome resistive laminates, Applicant is aware of a variety of discrete and thin film laminates which have been developed over the years. Ones of such devices are particularly disclosed in U.S. Pat. Nos. 3,400,066; 3,622,410; 3,629,776; 3,691,007; 3,857,683; 3,930,975; 3,981,691; and 4,021,277. Applicant is also aware of an article from Electronic Engineer Magazine, by H. J. Pawluk, entitled Thin Film Resistors Plated on Circuit Boards (Jul. 1967).

Of the foregoing references, ones of the patents disclose conventionally plated, thin film layers of ni-chrome which are deposited in various structures. Others disclose sequential fabrication processes for creating monolithic circuits wherein thin films of nichrome are sputter applied directly onto patterned regions to create specific patterned circuits; as distinguished from processes wherein preformed laminates are stacked and assembled within a multi-layer board.

Advantages gained from the latter lamination techniques include increased packing densities through the embedding of many of the resistive components, thereby freeing surface area on the board for active components and providing shorter interconnect distances. Distributed inductance and noise are reduced and therefore the frequency and operating speed of a board is increased. Reliability is also improved through minimized numbers of discrete interconnections. Patterning techniques further enable increased numbers of resistors with less effort and cost to provide same as part of a prepared assembly.

SUMMARY OF THE INVENTION

It is accordingly a primary object of the present invention to provide a resistive laminate for use in multi-layer printed circuit boards which exhibit uniform electrical and mechanical properties over the laminate.

It is a further object of the invention to provide a laminate including a sputter coated resistive layer, preferably comprised of nickel-chrome.

It is a further object of the invention to provide a fabrication step wherein a conductive foil is uniformly supported on a platten and electrically isolated from ground potential.

It is a further object of the invention to provide a fabrication step wherein the conductive foil is arranged to permit coupling of the foil and support fixture to a charge of opposite polarity to that of a charged etchant for sputter removing contaminants and/or a foil passivation material.

It is a yet further object of the invention to provide a lamination process wherein a sputter coated conductive foil is isostatically bonded to a supporting epoxy resin within a pressurized, thermally controlled environment.

It is a still further object of the invention to stress relieve the prepared laminate in a dry thermal environment after lamination.

Various of the foregoing objects, advantages and distinctions of the invention are particularly achieved in a presently preferred fabrication process which yields laminates exhibiting improved mechanical and electrical tolerances over other available devices.

The process includes a jigging step wherein a selected conductive foil is compressively secured about its periphery to a uniformly flat backing plate or platten and whereby a uniform target to substrate distance is maintained with a consequent uniform thickness of sputtered target material.

A bombardment or sputter etch step using Argon gas, wherein the jig fixture and foil is oppositely charged relative to the gas particles, pre-cleans the foil surface, prior to physical vapor deposition (PVD) (e.g. sputter coating) of the resistive layer.

Otherwise, the resistive target material is applied over repeated cycles via a PVD process step, preferably, a DC magnetron sputtering step. In a preferred construction, a nickel-chrome-aluminum-silicone target is used.

Lamination of the conductive/resistive foil to a support substrate is achieved by isostatically bonding the resistive layer to a resin support. A plurality of stacked laminates are simultaneously bonded within a controlled environment of uniform temperature and pressure and wherefrom the resultant laminates exhibit less inherent stress. The laminates may be further stress relieved in a subsequent baking step with uncontrolled cooling.

The resultant laminates have particularly exhibited improved dimensional characteristics; less resistance variation across the laminate surface; and less resistance drift over time, in contrast to plated bath, hydraulically bonded laminates. These improvements are magnified when incorporated into multi-layer printed circuit boards used in applications requiring relatively high frequency signals.

Still other objects, advantages and distinctions of the invention will become more apparent upon reference to the following detailed description with respect to the appended drawings. Before referring thereto, it is to be appreciated the following description is made by way of the presently preferred and variously considered constructions only. The description should accordingly not be interpreted in strict limitation, but rather should be interpreted to include all those equivalent constructions within the spirit and scope of the claims hereinafter set forth. To the extent improvements and other modifications have been considered, they are described as appropriate.

BRIEF DESCRIPTION OF THE DRAWINGS

FIG. 2 shows a cross section view through a laminate constructed from the process of FIG. 1.

FIG. 3, comprised of FIGS. 3a to 3c, shows cross section views of the evolving laminate through the fabrication process.

FIG. 6 shows a partial cross section views of a processed multi-layer assembly using the present laminate.

DESCRIPTION OF THE PREFERRED EMBODIMENT

Figure 1:
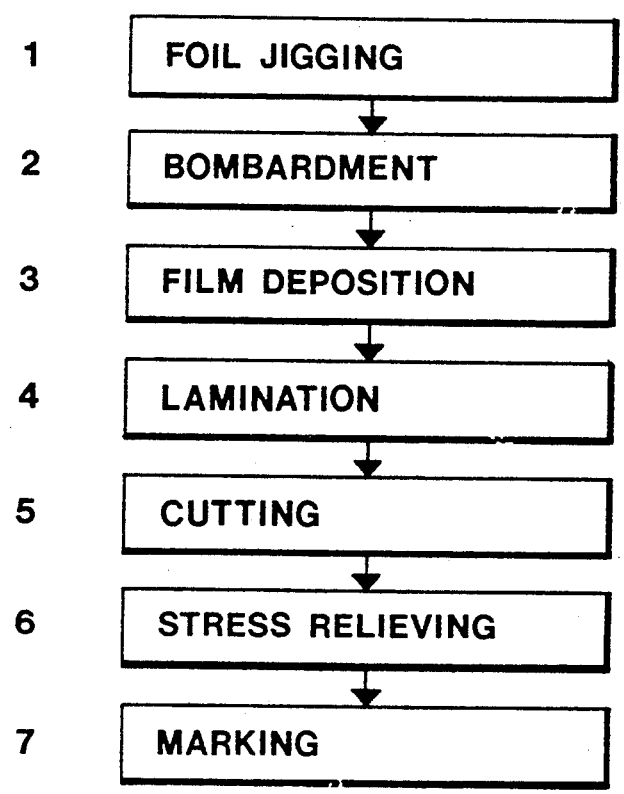
FIG. 1 shows a process flow diagram of the steps employed to fabricate the present laminates.

Referring to FIGS. 1, 2 and 3, a block diagram and the related evolutionary cross sectional structures are shown through the principle process steps used to construct the improved laminate 2 of the present invention. This process includes the mounting of a selected conductive copper foil 4 of predetermined electrical characteristics within a jig fixture 6 (reference FIGS. 4 and 5). The foil 4 is thereby drawn taught across a uniformly flat platten or backing plate 8. A uniformly flat deposition surface is consequently achieved.

The fixturing of the foil 4 particularly eliminates any gaps between the platten 8 and foil 4 which could disadvantageously cause a concentrated plasma between the foil 4 and platten 8, referred to as "hollow cathode effect." The elimination of bows, twists and creases in the foil 4 also reduces warpage with thermal expansion and generally maintains the foil at a constant foil to target distance over the entire surface of the foil.

Figure 4:
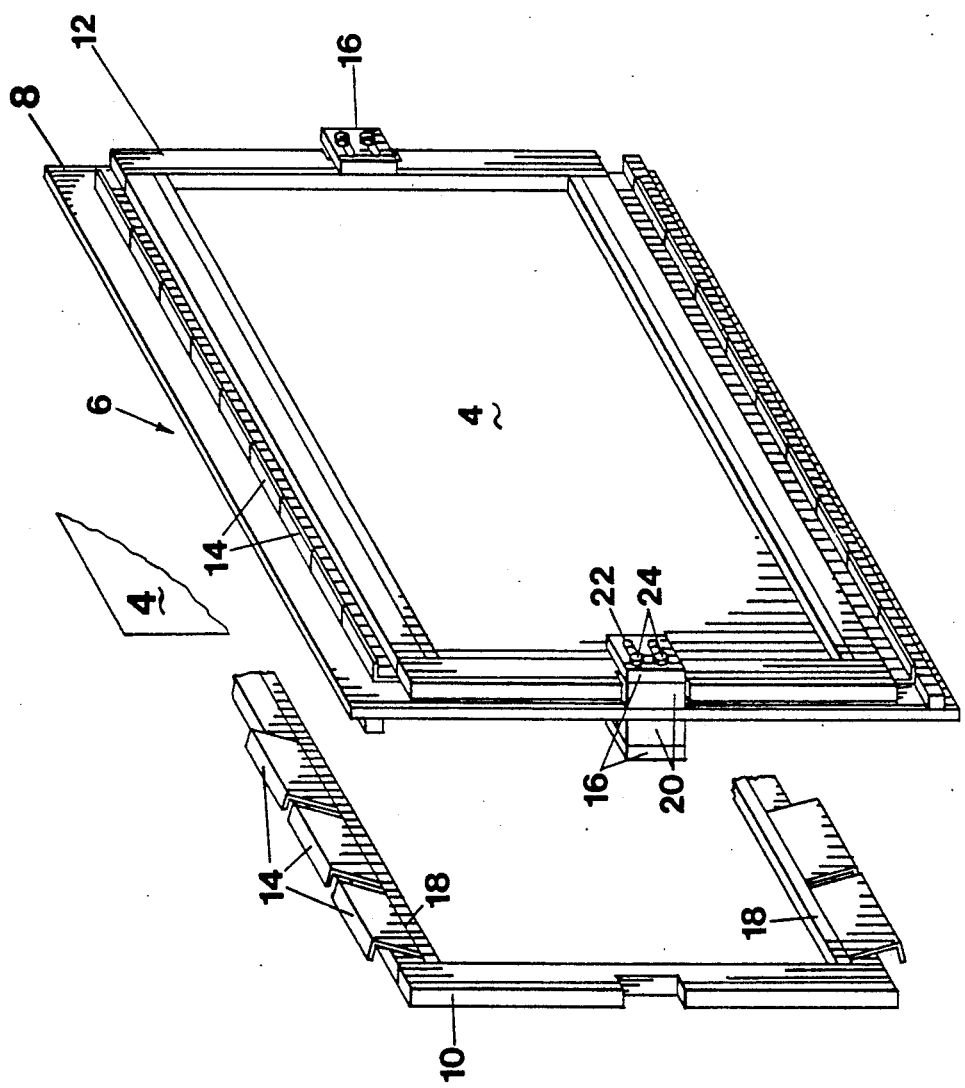
FIG. 4 shows an isometric drawing in partial cutaway and exploded assembly of a jig used to prepare the conductive foil prior to sputter deposition.

With reference to FIG. 4, the jig fixture 6 comprises the platten 8, a pair of rigid rectangular clamp frames 10 and 12 and spring biased shims 14 that mount about the periphery of the frames. The frames 10, 12 permit simultaneous deposition on two separate foils 4. Front and back latches 16 mounted to the lateral sides of the platten 8 slideably cooperate with the frames 10, 12, when compressed against the platten 8, to capture the frames about the foil 4 and draw the foil 4 tight to the flat surface of the platten 8, while exposing the center region of each foil 4 to the target.

A uniform compression is particularly achieved with the use of the plurality of spring stock shims 14 that mount within slots 18 in the frames 10, 12. When relaxed, the shims 14 mount at an angle to the frames 10, 12, but are drawn flat along with the foil 4 as the frames are squeezed and positioned beneath the latches 16. The latches particularly comprise individual stand-offs 2 which support a sliding latch plate 22 relative to a pair of shouldered pegs 24.

Figure 5:
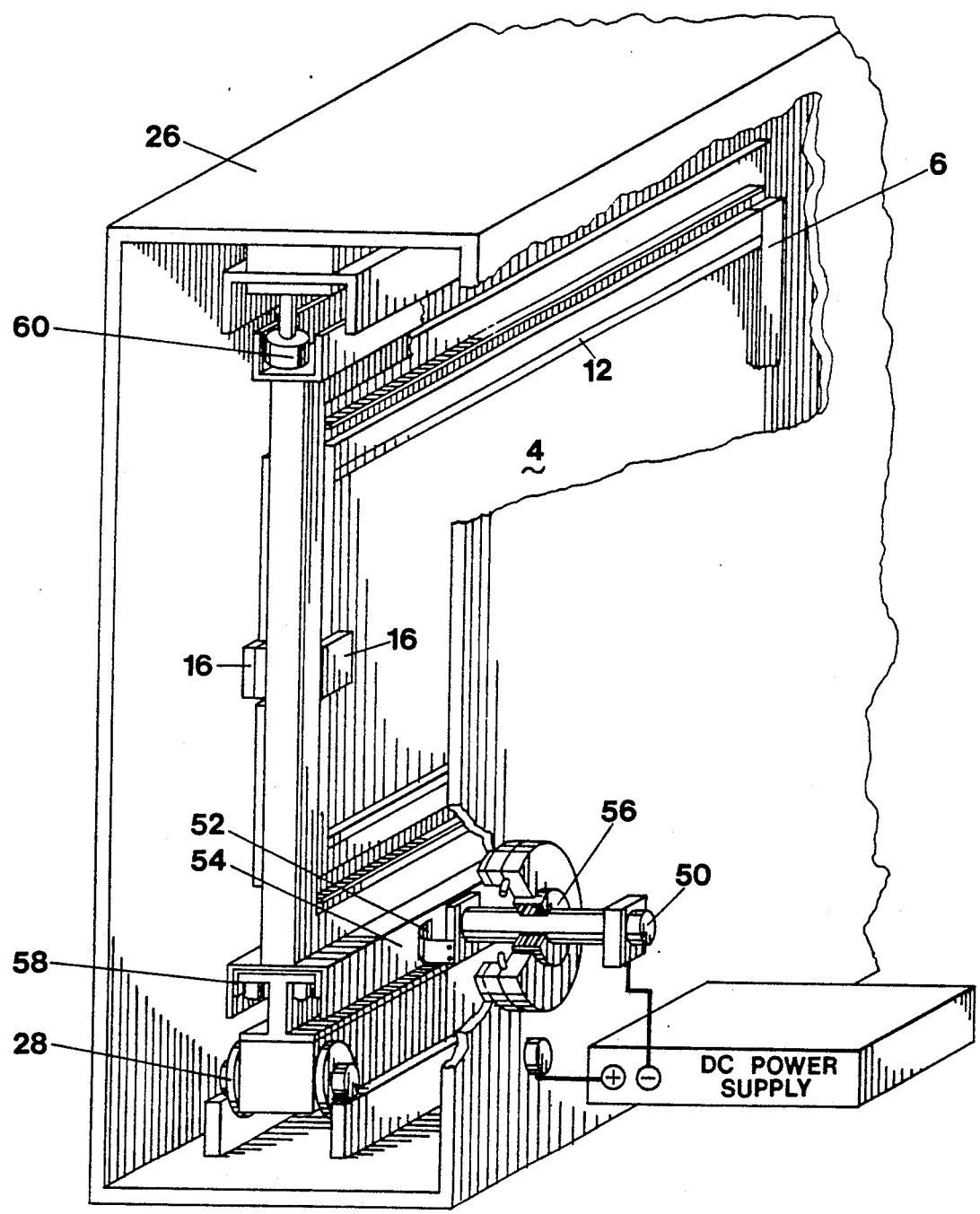
FIG. 5 shows the jigged foil as it mounts to a rollered carrier and within a deposition chamber.

Referring to FIG. 5, the jig fixture 6 is subsequently supported within a suitably sized DC magnetron sputtering chamber 26. This apparatus includes multiple chamber portions which are isolated from each other, but wherebetween the foil 4 may be transferred as necessary to effect the following process steps.

During a bombardment or sputter etching step (reference FIG. 3a) the fixture and foil are biased relative to each other, and whereby a glow discharge of Argon atoms bombard the foil 4 to remove surface contaminants and any contained passivation layer. The contaminants deposit on the chamber walls. The exposure time, charge and atmosphere are obtained in conventional fashion. Alternative technologies which might be used are reactive sputter etching with reactive gases or possibly chemical pre-treatments, depending upon the materials to be removed.

To be further noted from FIG. 5 is that the jig fixture 6 is supported in a rollered track and carrier assembly 28. The arrangement of the assembly 28 is such that the fixture 6 is electrically isolated from the ground potential of the cleaning chamber. Thus, during the sputter etching step described above, the fixture 6 is connected via the power supply to a desired negative potential relative to the positively charged gas. This is accomplished via a conductor 50 and contact 52 which contacts a sputtering shield or contact plate 54 and upon which the jig fixture 6 rests. Otherwise, insulators 56, 58 and 60 isolate the fixture 6 from the remainder of the cleaning chamber.

Once appropriately cleaned and with reference to FIG. 3b, each conductive foil 4 is transferred to a sputtering chamber, wherein a target and the foil are appropriately biased, and exposed to atoms removed from a selected target material mounted adjacent the interior side walls of the chamber. This is accomplished in an Argon glow discharge environment. The atoms released from the target deposit on the foil 4 to form a uniform thin film 32. Typically, each cycle provides for the deposition of a uniform incremental layer. Multiple cycles of the sputtering step are thereafter repeated to obtain a film 32 of a desired thickness and for the present applications on the order of 500 to 800 angstroms thick.

It is to be appreciated that any surface variations are to be avoided, since they will be replicated and enhanced over the subsequent steps. Alternative deposition methodologies might comprise vacuum evaporation or CVD. Other sputtering techniques may include DC diode, RF diode or RF magnetron.

Presently, a target comprised of approximately 56% nickel, 38% chrome, 4% aluminum and 2% silicone has been found to provide resistive layers 32 of desired electrical characteristics for the intended application. A variety of other target materials and/or different compositional mixtures can, however, be employed to a similar end. Other resistive target materials which might be employed are nickel-vanadium, tantalum-nitride, nickel-phosphorous or chrome-aluminum.

Nickel-chrome in concentrations of 80-50% nickel and 20-40% chrome along with 0 to 10% of other dopants, otherwise, is believed to be a more stable material and provides a film of preferred dimensional and electrical properties, as opposed to nickel-phosphorous or various of the other plated materials which are commonly used for the mentioned digital applications.

Depending upon printed circuit board size desired, a suitably sized sputtering chamber 26 is used to effect the foregoing deposition. Presently, a chamber having internal dimensions which accommodate the fabrication of laminates 2 on the order of 51 by 129.5 centimeters is used. Larger or smaller chambers 26 may however be used to a similar end.

With the fabrication of a suitable conductive/resistive foil 34, it next becomes necessary to bond the foil 34 to a suitable glass epoxy resin substrate 36. The combination structure 2 can then be used in the further fabrication of a multi-layer printed board construction 38 such as shown in FIG. 6. Alternative substrates might comprise, among others, modified epoxies, tetra-functional epoxies, high temperature epoxies, bismaleimide blends, polymides, modified polymides, or cyanate esters.

In this later regard and with further attention to FIG. 3c, the prepared resistive foil 34 is bonded to a glass epoxy resin substrate 36 in an isostatic lamination step, as distinguished from the conventional use of a hydraulic press to create heat and a pressurized bond. Hydraulic bonding, otherwise, is employed with the present laminate, only during the lamination of the laminates 2 into a multi-layer assembly 38.

Less stress is otherwise placed on the laminate 34 by way of an isostatic bonding step. During a hydraulic press cycle, the substrate 36 otherwise undergoes directional distortion which is not induced when equal pressure is applied on all surfaces of the substrate 36 and foil 34, as the foil 34 heats and bonds to the substrate 36.

Relative to the lamination step and with reference to FIG. 3c, bonding occurs simultaneously for a number of foils 34 relative to their matching substrates 36. That is, individual foils 34 and resin substrates 36 are organized with inactive spacer layers (not shown) between pairings to create a so called "book" arrangement. The layers are vertically stacked and indexed relative to a surrounding bag (not shown). The book, in turn, is set within an autoclave.

Bonding occurs through the application of conventionally determined pressures and temperatures and bonding times and during which the mating surfaces between each of the resistive layers 32 and substrates 36 undergo a thermal bonding to sufficiently support one to the other until a permanent bonding occurs during the construction of the multi-layer board. A nominal peel strength of 7 to 10 pounds per inch is obtained for the present materials, but which may be 3 to 7 pounds per inch for other materials.

Although the formed laminates 2 inherently exhibit relatively low stress, each may be further subjected to a heating step at atmospheric pressure. Any stress produced from the bonding step is thereby removed and the epoxy substrate 36 relaxes relative to the foil 4. This step is performed in the autoclave or in a separate oven through a second heating at atmospheric pressure, with an uncontrolled cool-down to room temperature.

Otherwise and/or prior thereto, the prepared laminates 2 are unbagged, cleaned, trimmed to size, and marked with appropriate markings to identify the specified characteristics of each laminate 2. A passivation layer or oxide layer may also be applied to the exposed surface of the foil 4 to protect it prior to subsequent processing, such as is later performed during the fabrication of the assembly of FIG. 6.

With attention lastly directed to FIG. 6, subsequent processing may comprise the addition of a ground plane and formation of conductive paths or may comprise the fabrication of a more complex multi-layer assembly. The assembly 38, otherwise, is comprised of an upper conductive foil layer 4 which has been photo-lithographically processed to provide a plurality of contact pads 40. The pads 40 overlay individual resistors or resistance zones 42 of predetermined surface areas which are defined relative to the area of the resistive layer 32 between the pads 40. A second conductive or ground foil 4 is otherwise bonded to the lower surface of the substrate 36. Wire connection pads, through holes (not shown) or other interconnect means are later formed to connect the external circuitry (not shown) to the layers of the assembly 38. In lieu of a ground plane foil 4, it is also to be appreciated a second laminate or embedded resistor layer might be included in the assembly 38.

With the use of the present sputtered and isostatically bonded laminates 2, multi-layer assemblies 38 which are substantially more uniform electrically and mechanically than conventionally formed, plated assemblies have become possible. These assemblies 38 have, in turn, found particular advantage in high frequency digital applications.

While the invention has been described with respect to its presently preferred construction and variously considered modifications, it is to appreciated still other equivalent processes and/or apparatus might be suggested to those of skill in the art. Accordingly, the following claims should be interpreted to include all equivalent embodiments within the spirit and scope thereof.

What is claimed is:

1. A method for fabricating a resistive laminate for a printed circuit board comprising:
   (a) securing a conductive metal foil to contact a planar support surface;
   (b) exposing the foil in a glow discharge environment for a sufficient duration to remove contaminants from the foil;
   (c) exposing the foil in a glow discharge environment containing a resistive target material to deposit a layer of the target material onto said foil; and
   (d) isostatically bonding the resistively coated foil to a substrate in a pressurized gas environment.

2. A method as set forth in claim 1 wherein said resistive target material is substantially comprised of nickel and chrome.

3. A method as set forth in claim 2 wherein said resistive target material comprises relative percentage concentrations of 80 to 50% nickel, 20 to 40% chrome and 0 to 10% other dopants.

4. A method as set forth in claim 1 wherein said resistive target material is selected from a group consisting of nickel-chrome, nickel-vanadium, tantalum-nitride, nickel-phosphorous or chrome-aluminum.

5. A method as set forth in claim 1 wherein during said contamination removal step said foil is biased relative to a surrounding gas environment.

6. A method as set forth in claim 1 including the further step of heating the bonded foil and substrate in a pressurized environment and whereby stress is relieved from the foil and substrate.

7. A method as set forth in claim 5 wherein the gas comprises carbon dioxide or nitrogen.

8. A method as set forth in claim 7 wherein said bonding occurs at temperatures in a range of 335 to 450 degrees Fahrenheit and pressures of 25 to 250 psi.

9. A method as set forth in claim 1 wherein said substrate is selected from a group consisting of modified epoxies, tetra-functional epoxies, high temperature epoxies, bismaleimide blends, polymides, modified polymides or cyanate esters.

10. A method as set forth in claim 1 wherein said deposition step is performed using sputter desposition apparatus.

11. A method as set forth in claim 1 wherein the contamination removal and the deposition of the resistive target material are performed with apparatus selected from a class containing DC magnetron, RF magnetron, DC diode, and RF diode sputtering apparatus.

12. A method as set forth in claim 11 wherein said resistive target material is substantially comprised of nickel and chrome.

13. A method as set forth in claim 1 wherein the foil is supported from a planar support fixture comprising:
(a) a planar backing plate;
(b) a framework circumscribing a deposition aperture; and
(c) means for biasing said foil into uniform contact with said backing plate; and
(d) means for securing said framework to said backing plate.

14. A method for fabricating a resistive laminate for a printed circuit board comprising:
(a) removing contaminants from a conductive metal foil;
(b) repeatedly exposing said foil in a vacuum vapor deposition environment to deposit a resistive material on said foil; and
(c) bonding the resistively coated foil to a support substrate.

15. A method for fabricating a resistive laminate for a printed circuit board comprising:
(a) exposing a conductive metal foil to a chemical etchant for a sufficient duration to remove contaminants from the foil;
(b) securing the foil to contact a planar support surface;
(c) performing multiple exposures of the foil in a vacuum evaporation environment containing a resistive target material to deposit a predetermined layer of target material onto the foil with each exposure, whereby a desired composite thickness is obtained; and
(d) isostatically bonding the resistively coated foil to a substrate in a pressurized gas environment.

16. A method for fabricating a resistive laminate for a printed circuit board comprising:
(a) exposing a conductive metal foil to a chemical etchant for a sufficient duration to remove contaminants from the foil;
(b) securing the foil to contact a planar support surface;
(c) exposing the foil in a chemical vapor deposition environment containing a resistive material to deposit a predetermined layer of the resistive material onto the foil, whereby a desired thickness is obtained; and
(d) isostatically bonding the resistively coated foil to a substrate in a pressurized gas environment.

17. A method for fabricating a resistive laminate for a printed circuit board comprising:
(a) exposing a conductive metal foil to a chemical etchant for a sufficient duration to remove contaminants from the foil;
(b) securing the foil to contact a planar support surface;
(c) performing multiple exposures of the foil in a glow discharge environment containing a resistive target material to deposit a predetermined layer of the target material onto the foil with each exposure, whereby a desired composite thickness is obtained; and
(d) bonding the resistively coated foil to a substrate in a pressurized gas environment.

18. A multi-layered printed circuit board comprising:
(a) a plurality of support substrates of an order greater than three square feet wherein each substrate is formed from an identical material selected from a class containing glass expoxy resins, modified epoxies, tetra-functional epoxies, high temperature epoxies, bismaleimide blends, polymides, modified polymides or cynate esters;
(b) a plurality signal layers containing conductive pathways sequentially formed onto selected ones of said support substrates as said multi-layered printed circuit board is assembled; and
(c) a resistor layer comprised of a laminate including a conductive foil isostatically bonded to a support substrate material identical to the signal layer support substrates and having a predetermined sheet resistance at all points over the area of the resistor layer in relation to each of the signal layers, wherein the foil is coated with a resistive material selected from a class containing nickel-chrome, nickel-vanadium, tantalum-nitride, nickel-phosphorous or chrome-aluminum, and deposited to a uniform thickness over at least one surface of the foil.

19. A fixture for supporting a conductive foil within a deposition apparatus comprising:
(a) a planar backing plate;
(b) a framework circumscribing a deposition aperture; and
(c) means for biasing said foil into uniform contact with said backing plate; and
(d) means for securing said framework to said backing plate.

20. Apparatus as set forth in claim 19 including a second framework and wherein the first and second frameworks are positioned on front and rear surfaces of said backing plate relative to respective first and second foils.

21. Apparatus as set forth in claim 19 wherein said biasing means comprises a plurality of resilient members secured to project at an acute angle relative to said framework such that upon contacting said foil and compressing said framework to said backing plate said foil is drawn taught thereto.

* * * * *